United States Patent
Kuroda et al.

(10) Patent No.: US 8,462,005 B2
(45) Date of Patent: Jun. 11, 2013

(54) COMMUNICATION CIRCUIT TO MEASURE AND COMMUNICATE THE STATE OF A BATTERY UNIT IN A VEHICLE

(75) Inventors: Kazuto Kuroda, Yokohama (JP); Shinichiro Kosugi, Saku (JP); Nobuo Shibuya, Hiratsuka (JP); Yasuhiro Miyamoto, Saku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 413 days.

(21) Appl. No.: 12/890,061

(22) Filed: Sep. 24, 2010

(65) Prior Publication Data
US 2011/0075712 A1 Mar. 31, 2011

(30) Foreign Application Priority Data
Sep. 30, 2009 (JP) .................................. 2009-228135

(51) Int. Cl.
*G08B 21/00* (2006.01)
(52) U.S. Cl.
USPC .......................... 340/636.1; 307/9.1; 320/116
(58) Field of Classification Search
USPC ..... 340/636.1–636.19; 307/9.1, 10.7; 429/61; 320/109, 135, 136, 116
See application file for complete search history.

(56) References Cited

U.S. PATENT DOCUMENTS
7,714,540 B2 * 5/2010 Shibuya et al. ............... 320/119
2010/0090653 A1 * 4/2010 Kuwano et al. ............... 320/136

FOREIGN PATENT DOCUMENTS
JP 2001-7865 1/2001

* cited by examiner

*Primary Examiner* — Jeffery Hofsass
(74) *Attorney, Agent, or Firm* — Oblon, Spivak, McClelland, Maier & Neustadt, L.L.P.

(57) ABSTRACT

According to one embodiment, a communication circuit includes a direct-current converter circuit configured to generate a second power supply potential different from a second reference potential by a predetermined potential, from a first power supply potential, a first receiving circuit configured to receive a binary communication signal, whose one level is at a first reference potential, through a first signal input terminal, by a differential transmission method, a first level shift circuit configured to convert the communication signal received by the first receiving circuit into a binary communication signal, whose one level is at the second reference potential, and the other level is at the second power supply potential, and a first transmission circuit configured to output the binary communication signal converted by the first level shift circuit, through a first signal output terminal, by a differential transmission method.

14 Claims, 10 Drawing Sheets

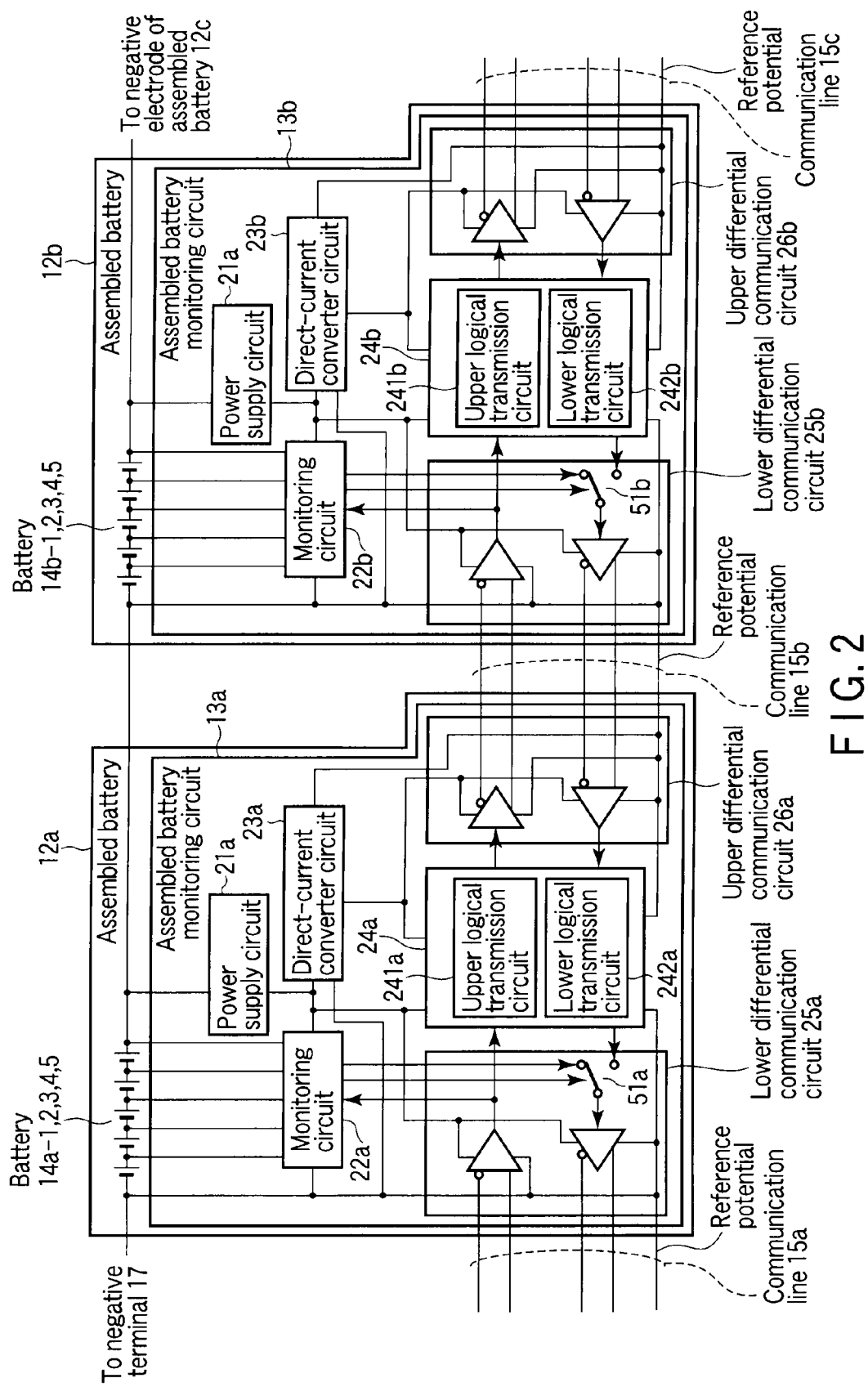
F I G. 2

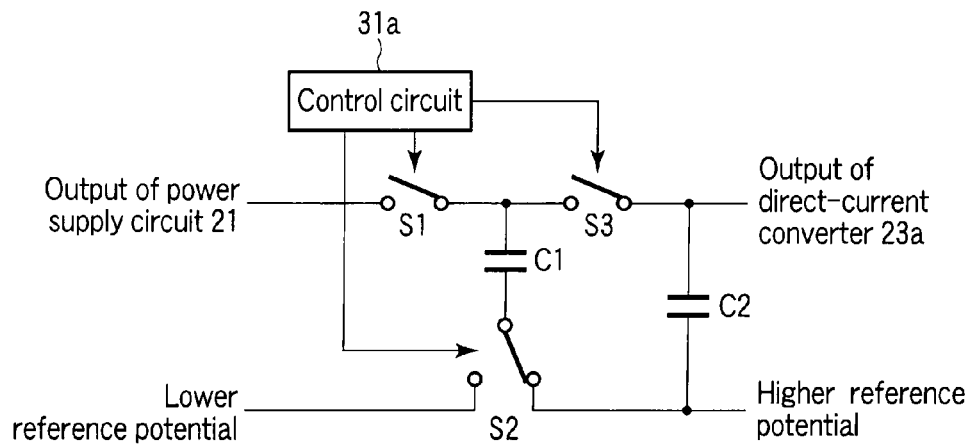
F I G. 3
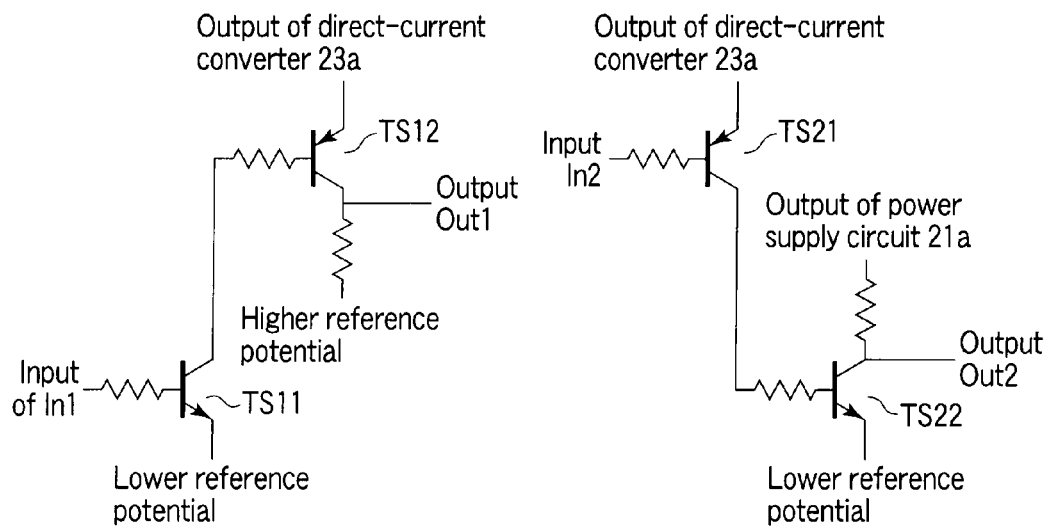
F I G. 4A
F I G. 4B

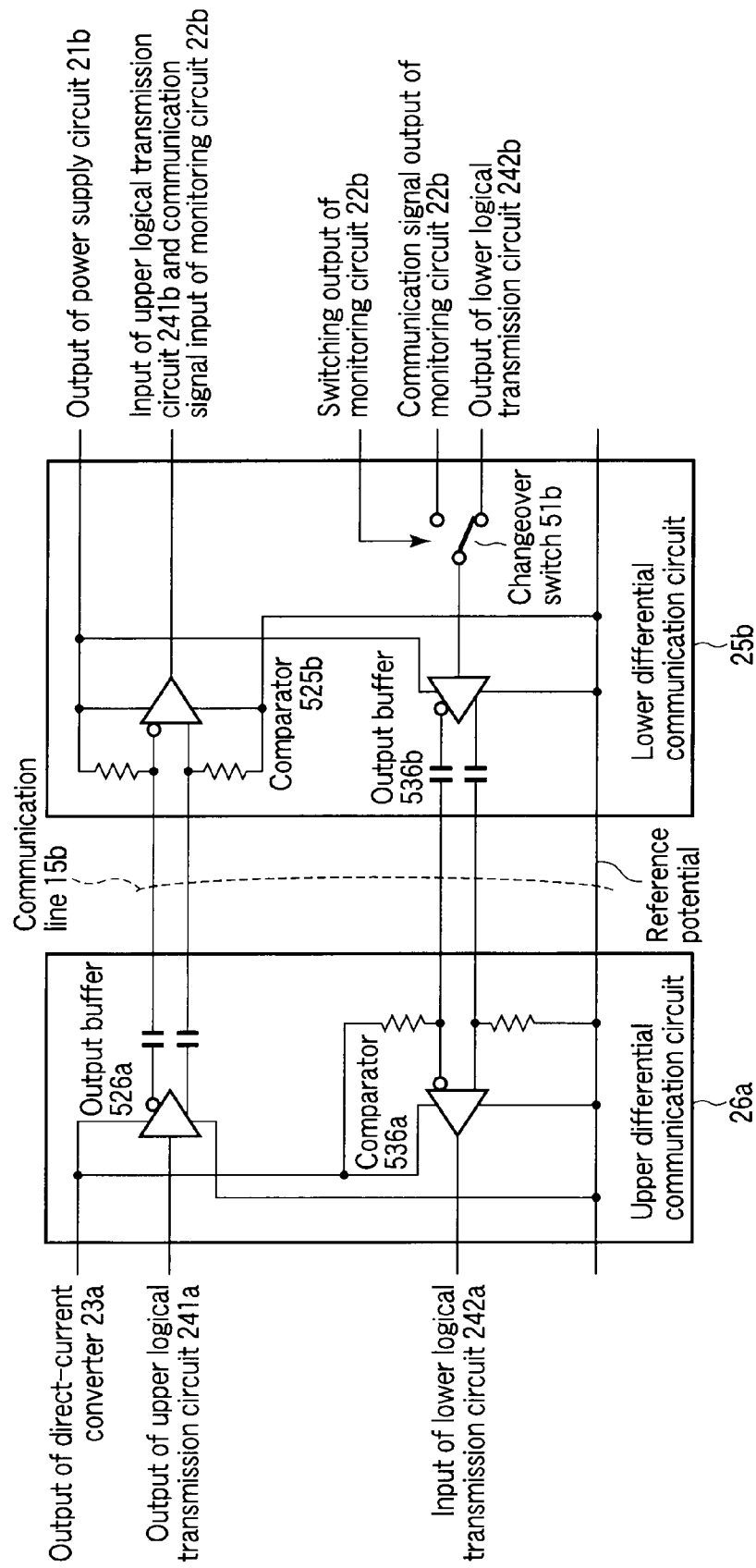
F I G. 5

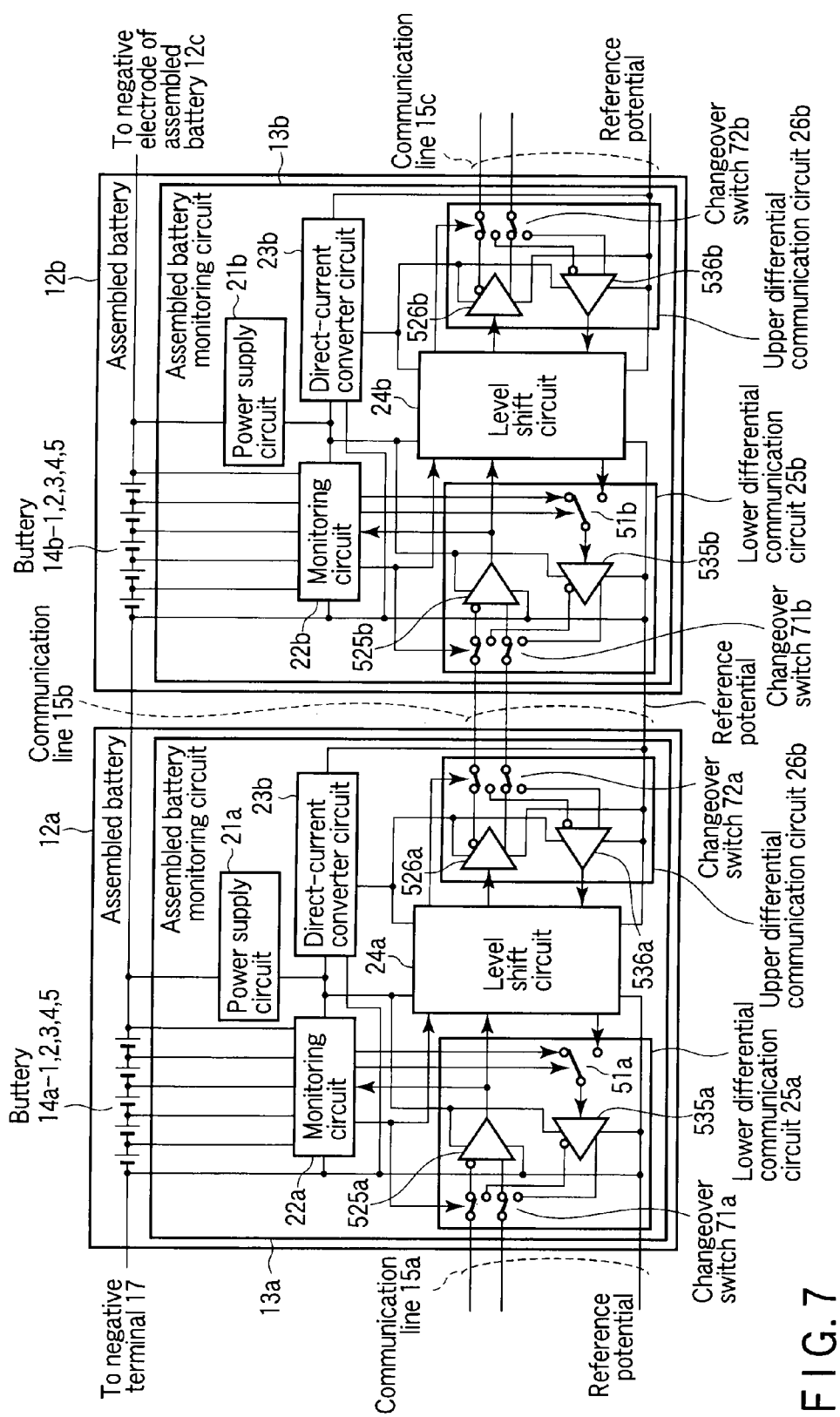
F I G. 7

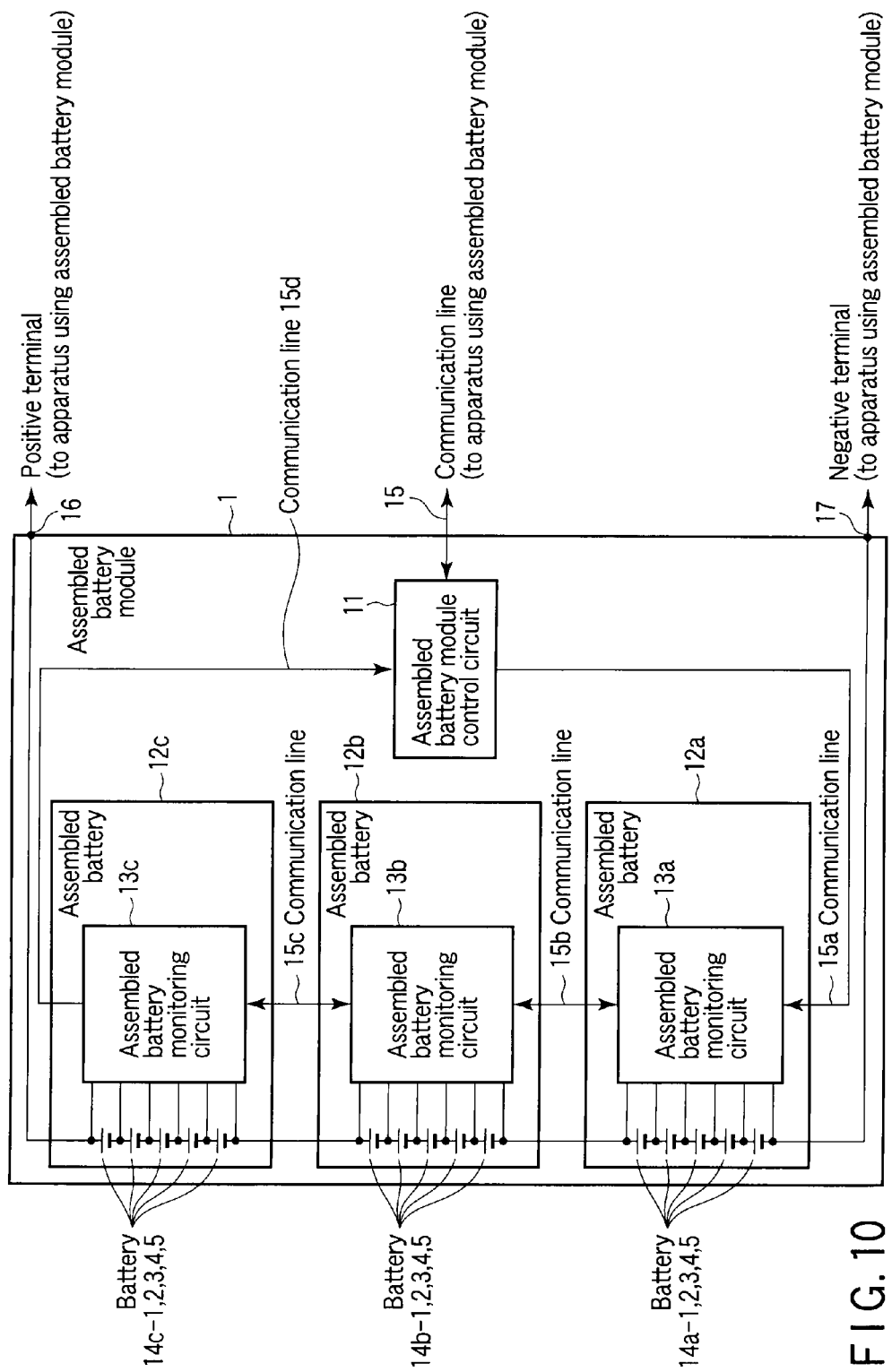
F I G. 10

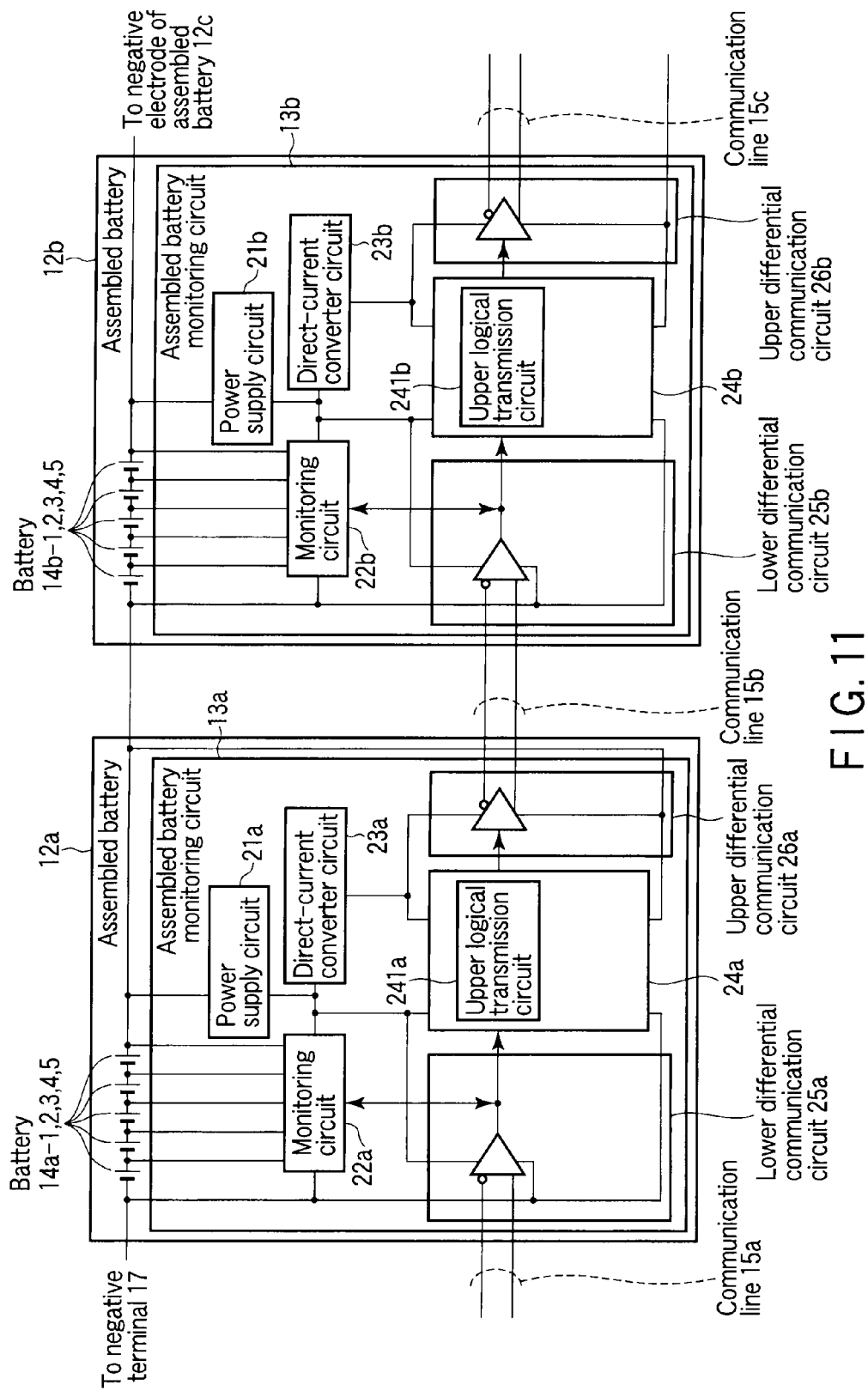
F I G. 11

COMMUNICATION CIRCUIT TO MEASURE AND COMMUNICATE THE STATE OF A BATTERY UNIT IN A VEHICLE

CROSS-REFERENCE TO RELATED APPLICATIONS

This application is based upon and claims the benefit of priority from Japanese Patent Application No. 2009-228135, filed Sep. 30, 2009; the entire contents of which are incorporated herein by reference.

FIELD

Embodiments described herein relate generally to a communication circuit, an assembled battery unit, and a vehicle.

BACKGROUND

An assembled battery module uses a plurality of assembled batteries. Each assembled battery comprises a plurality of batteries and assembled battery monitoring circuits. The monitoring circuit of each assembled battery is powered by the batteries composing the assembled battery.

When the assembled batteries are connected in series, that is, the monitoring circuits of the assembled batteries are connected in series through a communication line, the monitoring circuit of the assembled battery communicates with the other monitoring circuits of the other assembled batteries with a large potential difference. This causes a problem in the possibility and stability of communication.

In the prior art, as a method of communication under conditions generating a large potential difference, it is known to isolate a reference potential of each circuit by using an isolation transformer or optical isolator.

Generally, a large current is necessary for a circuit which makes communication in an isolated state by using an isolation transformer or optical isolator. Thus, if such a circuit which makes communication in an isolated state is used in a monitoring circuit of an assembled battery, power may be wasted, and the power storing performance of an assembled battery module may be decreased.

Besides, when an assembled battery module is actually used, the communication stability is demanded even for noise from an inverter or converter.

Therefore, there are technical needs to ensure stable communication even for a state with a large difference between the reference potentials of communicating circuits.

BRIEF DESCRIPTION OF THE DRAWINGS

FIG. 2 shows exemplary configurations of assembled battery monitoring circuits according to an embodiment;

FIG. 3 shows an exemplary configuration of a direct-current converter circuit according to an embodiment;

FIG. 4A is an exemplary diagram for explaining an exemplary configuration of a level shift circuit according to an embodiment;

FIG. 4B is an exemplary diagram for explaining an exemplary configuration of a level shift circuit according to an embodiment;

FIG. 5 is an exemplary diagram showing the connection between an upper differential communication circuit and a lower differential communication circuit according to an embodiment;

FIG. 7 shows exemplary configurations of assembled battery monitoring circuits according to an embodiment;

FIG. 10 is an exemplary diagram showing an assembled battery module using an assembled battery monitoring circuit according to an embodiment; and FIG. 11 is an exemplary diagram showing the configurations of the assembled battery monitoring circuits according to an embodiment.

DETAILED DESCRIPTION

In general, according to one embodiment, there is provided a communication circuit comprising a first reference potential input terminal configured to receive a first reference potential; a first power supply potential input terminal configured to receive a first power supply potential different from the first reference potential by a predetermined potential; a second reference potential input terminal configured to receive a second reference potential; a direct-current converter circuit configured to generate a second power supply potential different from the second reference potential by the predetermined potential, from the first power supply potential; a first receiving circuit configured to receive a binary communication signal, whose one level is at the first reference potential, through the first signal input terminal, by a differential transmission method; a first level shift circuit configured to convert the communication signal received by the first receiving circuit into a binary communication signal, whose one level is at the second reference potential, and the other level is at the second power supply potential; and a first transmission circuit configured to output the binary communication signal converted by the first level shift circuit, through a first signal output terminal, by a differential transmission method.

First Embodiment

Figure 1:
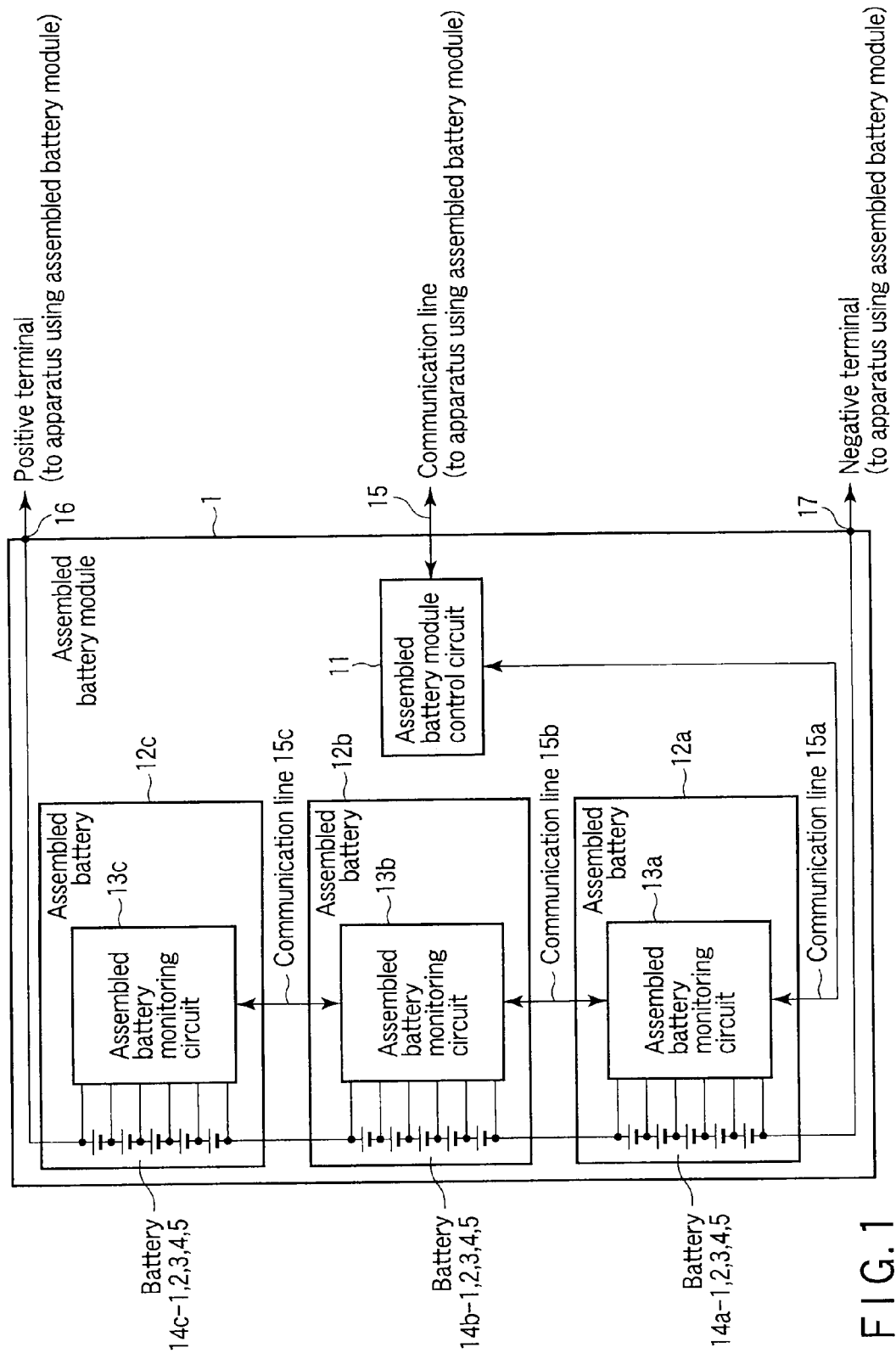
FIG. 1 is an exemplary diagram showing an assembled battery module using an assembled battery monitoring circuit according to an embodiment.

FIG. 1 is a diagram showing an assembled battery module 1 using an assembled battery monitoring circuit according to a first embodiment.

The assembled battery module 1 comprises a plurality of assembled batteries 12a to 12c, and an assembled battery module control circuit 11. Each assembled battery 12a to 12c comprises a plurality of batteries (cells) 14a to 14c and assembled battery monitoring circuits 13a to 13c.

The assembled batteries 12a to 12c are connected in series, and the ends of the series-connected batteries are connected to a positive terminal 16 and a negative terminal 17, respectively. The assembled battery monitoring circuits 13a to 13c are also connected in series through communication lines 15a to 15c, and one end of the line is connected to the assembled battery module control circuit 11.

In FIG. 1, one assembled battery comprises five batteries (cells) 14, but the number is not limited to five. In FIG. 1, three assembled batteries 12 are provided, but the number is not limited to three, and may be one, or two or more.

The assembled battery module 1 is connected to an apparatus using an assembled battery module, such as, an electric car and a power storing system, and charges and discharges the batteries 14a to 14c through the positive and negative terminals 16 and 17. In addition, the assembled battery module control circuit 11 communicates with an apparatus provided with the assembled battery module 1 (e.g. an electric car) about the maintenance, the remaining life, etc. of the assembled battery module 1.

Further, though not shown in the drawing, the assembled battery module 1 may be provided with an electromagnetic contactor to turn on and off the connection of the positive and negative terminals 16 and 17.

To collect information about the maintenance of the assembled battery module 1, the assembled battery module control circuit 11 collects voltage, temperature and other data of the batteries 14a to 14c comprising the assembled battery module 1, by communicating with the assembled battery monitoring circuits 13a to 13c.

The assembled battery monitoring circuits 13a to 13c measure the voltages and temperatures of the batteries comprising the assembled battery, based on an instruction through communication from the assembled battery module control circuit 11. A temperature is measured at several points in one assembled battery 12, and is not measured in all of the battery 14 in most cases.

All or a part of the elements comprising the assembled battery monitoring circuits 13a to 13c may be comprised of a semiconductor integrated circuit.

The assembled battery monitoring circuits 13a to 13c are connected in series as in the case of batteries 14a to 14c. Therefore, the assembled battery monitoring circuit 13 is configured to transfer data by a bucket brigade arrangement, so that the assembled battery module control circuit 11 can communicate with the last battery monitoring circuit 13c without interruption.

Now, a detailed explanation will be given of problems arising in the assembled battery module 1 configured as described above.

For example, in the case of assembled battery 12 comprising ten 3-V batteries 14 connected in series, a potential difference of 30 V occurs between the negative and positive electrodes as an assembled battery. Therefore, when the assembled battery monitoring circuit 13 is configured to have a voltage of the negative polarity of the assembled battery 12 as a reference potential, the circuit 13 has to communicate with another assembled battery monitoring circuit 13 connected to the positive polarity side with a potential difference of 30 V.

Since the assembled battery module 1 is connected to a power inverter or converter, a noise current over a wide frequency range flows in the positive and negative terminals 16 and 17. As a result, the connection wiring impedance between the assembled batteries 12 causes a potential difference between the positive terminal of one assembled battery and the negative terminal of the other assembled battery connected in series, and a common mode noise is generated between the assembled batteries. Further, as the assembled battery 12 itself has impedance, the voltage between the positive and negative electrodes as an assembled battery varies depending upon a charging/discharging current.

In this embodiment, the assembled battery monitoring circuits 13a to 13c are configured to solve the above problems.

FIG. 2 shows the configurations of the assembled battery monitoring circuits 13a and 13b according to the first embodiment. Hereinafter, when two circuits are compared, an upper circuit means a circuit close to the positive terminal 16, and a lower circuit indicates a circuit close to the negative terminal 17.

The assembled battery monitoring circuit 13a comprises a power supply circuit 21a, a direct-current converter circuit 23a, a level shift circuit 24a, a lower differential communication circuit 25a, an upper differential communication circuit 26a, and a monitoring circuit 22a.

The power supply circuit 21a generates voltage based on the potential of the negative electrode of the assembled battery 12a, by using the battery 14a as a power supply, and supplies the voltage to the monitoring circuit 22a, direct-current converter circuit 23a, level shift circuit 24a, and lower differential communication circuit 25a.

The direct-current converter circuit 23a generates a power supply with a potential shift necessary for communication with a circuit having a different reference voltage. For example, since the direct-current converter circuit 23a is provided in the lower assembled battery monitoring circuit 13a, it generates a power supply voltage based on the potential of the negative electrode of the upper assembled battery 12b.

The lower differential communication circuit 25a receives a signal from the not-shown lower assembled battery monitoring circuit 13, and transmits the signal to the upper differential communication circuit 26a through the level shift circuit 24a. Further, the lower differential communication circuit 25a receives a signal from the upper differential communication circuit 26a through the level shift circuit 24a, and transmits the signal to the not-shown lower assembled battery monitoring circuit 13.

The upper differential communication circuit 26a receives a signal from the lower differential communication circuit 25a through the level shift circuit 24a, and transmits the signal to the upper assembled battery monitoring circuit 13b. Further, the upper differential communication circuit 26a receives a signal from the upper differential communication circuit 13b, and transmits the signal to the lower differential communication circuit 25a through the level shift circuit 24a.

The level shift circuit 24a is positioned at the midpoint between the lower differential communication circuit 25a and upper differential communication circuit 26a, and functions as an interface capable of transferring a communication signal between different reference potentials. In other words, as described later, the level shift circuit 24a makes conversion between a binary communication signal handled by the lower differential communication circuit 25a, whose lower reference potential is zero, and a binary communication signal handled by the upper differential communication circuit 26a, whose higher reference potential is zero, by shifting the potential level.

The level shift circuit 24a comprises an upper logical transmission circuit 241a and a lower logical transmission circuit 242a. The upper logical transmission circuit 241a converts the level of a communication signal from the lower differential communication circuit 25a to the upper differential communication circuit 26a. The lower logical transmission circuit 242a converts the level of a communication signal from the upper differential communication circuit 26a to the lower differential communication circuit 25a.

The monitoring circuit 22a measures the states (voltage, temperature, etc.) of the battery 14a, receives an instruction of the assembled battery module control circuit 11 from the lower differential communication circuit 25a through the communication line 15a, and returns the measurement results. The monitoring circuit 22a controls a switch 51 (FIG. 5) of the lower differential communication circuit 25a, and prevents collision between its own communication and the communication from the upper differential communication circuit 26a.

FIG. 3 shows an exemplary configuration of the direct-current converter circuit 23a. The direct-current converter circuit 23a generates a power supply voltage based on the potential of an upper negative terminal, from a power supply based on the potential of a lower negative terminal. As a method of realizing this circuit, a charge pump circuit is known. FIG. 3 shows an example of a charge pump circuit.

Now, the operation of the direct-current converter circuit 23a is explained.

The control circuit 31a closes a switch S1, opens a switch S3, and sets a switch S2 to the lower reference potential position, thereby charging a capacitor C1. Then, the control circuit 31a opens switch S1, closes switch S3, and sets switch S2 to the higher reference potential position, thereby transferring the charge from capacitor C1 to a capacitor C2.

The above operation is repeated at short intervals (several kilohertz to several tens of kilohertz), and the charge of capacitor C2 becomes substantially equal to the charge corresponding to the output voltage of the power supply circuit 21a. Therefore, the output potential generated by the direct-current converter 23a becomes a value corresponding to the higher reference potential+(the output of the power supply circuit 21−the lower reference potential) and higher reference potential.

FIG. 4 shows diagrams for explaining exemplary configurations of the level shift circuit 24a. The level shift circuit transmits a logical signal between different reference potentials.

FIG. 4A shows the upper logical transmission circuit 241a, which transmits a logical signal from a lower potential side to a higher potential side. FIG. 4B shows the lower logical transmission circuit 242a, which transmits a logical signal from a higher potential side to a lower potential side.

Next, the operation of the upper logical transmission circuit 241a of FIG. 4A is explained.

A communication signal (binary) from the lower differential communication circuit 25a is applied to the upper logical transmission circuit 241a as an input signal In1. When input signal In1 is logical 1, a transistor switch TS11 conducts, and a lower reference voltage is applied to a gate of a transistor switch TS12. As a result, transistor switch TS12 conducts, and the output potential logical 1 from the direct-current converter 23a is applied to the upper differential communication circuit 26a as an output signal Out1. At this time, as described above, the output voltage from the direct-current converter 23a becomes a logical voltage corresponding to the upper reference voltage.

When input signal In1 from the lower differential communication circuit 25a is logical 0, or at a lower reference potential, transistor switch TS11 turns off. As a result, transistor switch TS12 turns off, and the higher reference potential logical 0 is applied to the upper differential communication circuit 26a as an output signal Out1.

As described above, the upper logical transmission circuit 241a converts a logical signal based on a lower reference potential, into a logical signal based on a higher reference potential.

The operation of the lower logical transmission circuit 242a of FIG. 4B is explained.

A communication signal (binary) from the upper differential communication circuit 26a is applied to the lower logical transmission circuit 242a as an input signal In2. When input signal In2 is logical 1, a transistor switch TS21 turns off. As a result, a transistor switch TS22 turns off, and the output logical 1 as a lower power supply potential from the power supply circuit 21a is applied to the lower differential communication circuit 25a as an output signal Out2.

When input signal In2 from the upper differential communication circuit 26a is logical 0, or at a higher reference potential, transistor switch TS21 conducts, and the output potential of the direct-current converter 23a is applied to the gate of transistor switch TS22. As a result, transistor switch TS22 conducts, and the lower reference potential logical 0 is applied to the lower differential communication circuit 25a as an output signal Out2. At this time, as described above, the output voltage from the power supply circuit 21a becomes a logical voltage corresponding to the lower reference voltage.

As described above, the lower logical transmission circuit 242a converts a logical signal based on a higher reference potential into a logical signal based on a lower reference potential.

FIG. 5 is a diagram showing the connection between the upper differential communication circuit 26a and lower differential communication circuit 25b. In FIG. 5, the upper circuit transmits a lower-to-upper communication signal, and the lower circuit transmits an upper-to-lower communication signal. Each circuit constitutes a differential transmission circuit.

The output potential of the direct-current converter 23a and higher reference potential are supplied to the upper differential communication circuit 26a as a power supply. The output potential of the power supply circuit 21 and higher reference potential are supplied to the lower differential communication circuit 25b as a power supply. As described above, the output potential of the direct-current converter 23a is at the power supply potential corresponding to the higher reference potential, or the same (substantially) potential as the output potential of the power supply circuit 21b. Therefore, the upper differential communication circuit 26a and lower differential communication circuit 25b operate at a power supply potential with no (small) potential difference.

Now, an explanation will be given of the operation of the differential transmission circuit shown as an upper circuit in FIG. 5.

A communication signal output from the upper logical transmission circuit 241a of the level shift circuit 24a is applied to an output buffer 526a of the upper difference communication circuit 26a. The output buffer 526a generates a pair of signals which phase are opposite each other from the input signal, and outputs the signals to the communication line 15b.

The comparator 525b takes the difference between the pair of signals, determines a threshold value from the result, and generates a signal. As a result, it is possible to reduce the influence of common mode noise from an inverter or converter superimposed in the communication line 15b.

The upper differential communication circuit 26a and lower differential communication circuit 25b make communication by taking the positive electrode of the assembled battery 12a and the negative electrode of the assembled battery 12b, which are connected in series, as a common reference potential. Thus, only a potential difference, which is caused by the wiring impedance of the positive electrode of the assembled battery 12a and the negative electrode of the assembled battery 12b, and the battery charging/discharging current, is generated between the upper differential communication circuit 26a and lower differential communication circuit 25b. Since the potential difference is a potential difference of the same phase for the communication line 15b, a same-phase component can be eliminated by making differential communication.

The generated signal is divided into two parts, and applied to the monitoring circuit 22b and the upper logical transmission circuit 241b of the level shift circuit 24b. The monitoring circuit 22b receives a transmission instruction from the assembled battery module control circuit 11, and the upper logical transmission circuit 241b transmits a communication signal to the upper assembled battery monitoring circuit 13c.

The output buffer 526a and comparator 525b are connected by two lines. The number of lines can be increased or decreased depending on the number of circuits.

The operation of the differential transmission circuit shown as a lower circuit in FIG. 5 is the same as that of the differential transmission circuit shown as an upper circuit, and a detailed explanation thereof is omitted.

The lower differential communication circuit 25b is provided with a changeover switch 51b. The changeover switch 51b is switched by a control signal from the monitoring circuit 22b. In other words, the monitoring circuit 22b transmits maintenance information, such as the voltage and temperature of the battery 14b collected by switching a communication channel, to the assembled battery module control circuit 11. At the other timing, the monitoring circuit 22b resets the communication channel to the original state to enable transmission of the maintenance information from the upper monitoring circuit 22c.

It is possible to insert a capacitor at the midpoint of a differential communication line as shown in FIG. 5. The capacitor can prevent breakage of the assembled battery monitoring circuits 13a and 13b caused by a large direct-current voltage accidentally applied to the communication line 15b when the series-connected battery 14 is disconnected in an accident.

Of course, the capacitor is not essential, and may not be used. In the case where a capacitor is inserted into the communication line 15b, a resistor connected to appropriate potential is connected to the input side to define the potential in the input side of the comparator 525b and 536a in FIG. 5.

Modifications of the First Embodiment

Figure 6:
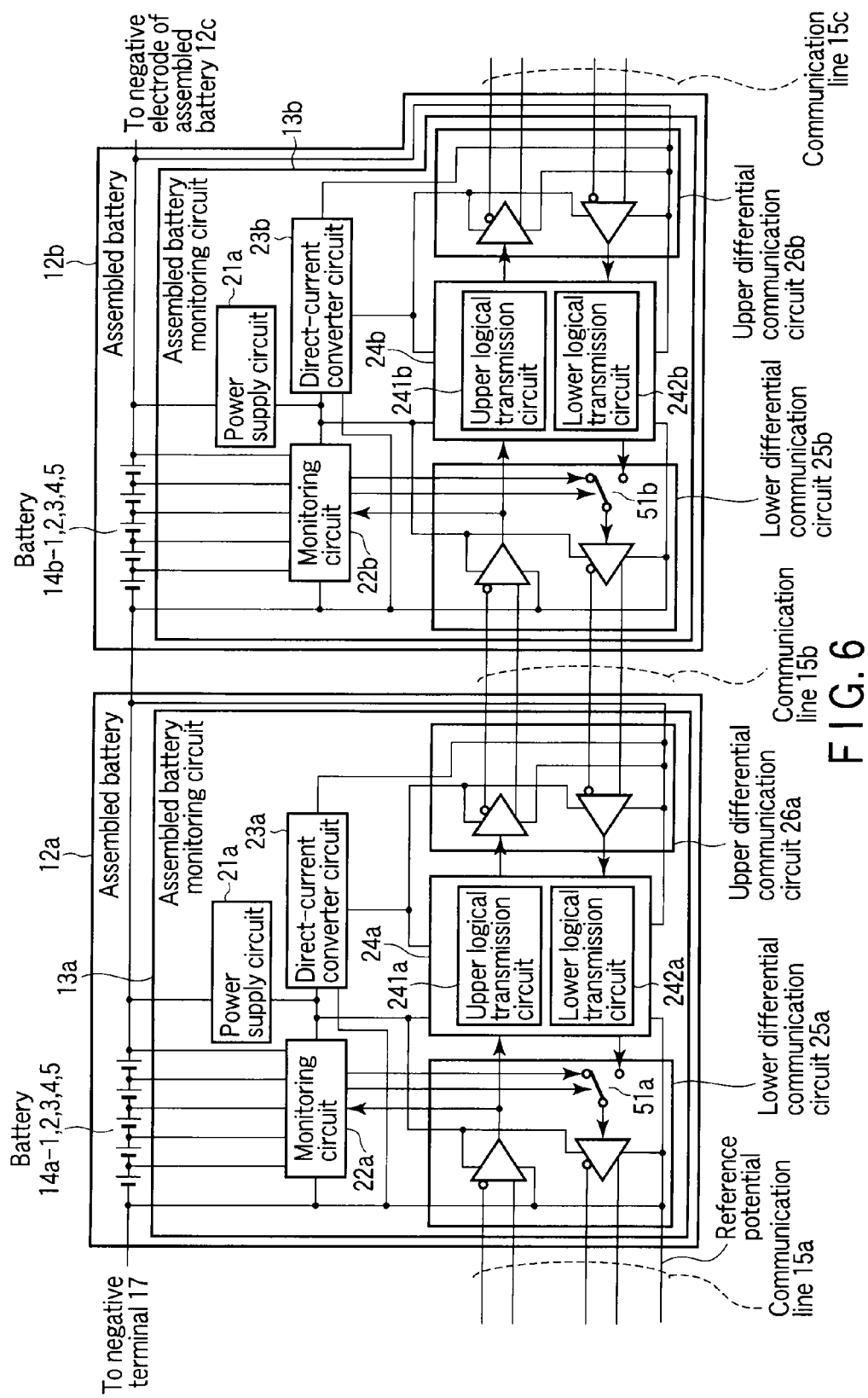
FIG. 6 shows exemplary configurations of the modifications of the assembled battery monitoring circuit according to an embodiment.

FIG. 6 shows the configurations of modifications of the assembled battery monitoring circuit 13.

In the modifications, the upper differential communication circuit 26a obtains a reference potential from the positive electrode side of the lower assembled battery 12a, and the lower differential communication circuit 25b obtains a reference potential from the negative electrode side of the upper assembled battery 12b. In such a case where each circuit independently obtains a reference potential, a reference potential line in the communication line (15a, 15b, 15c) shown in FIG. 2 can be eliminated.

Even if the circuit is configured as shown in FIG. 6, a differential communication system is adopted as described above, and communication is possible by eliminating the same-phase component.

In the first embodiment, as shown in FIG. 2, the upper differential communication circuit 26a obtains a reference potential from the negative electrode side of the upper assembled battery 12b. The upper differential circuit 26a may obtain a reference potential from the positive electrode side of the assembled battery 12a, and the lower differential communication circuit 25a may obtain a reference potential from the positive electrode side of the further lower assembled battery 12.

According to the configuration of the first embodiment, as a differential communication circuit is configured to have a level shift circuit and a direct-current converter, differential communication is possible without providing an expensive large power consumption isolation circuit, even in a sate where a reference potential difference is as high as several tens of volts.

Second Embodiment

A second embodiment is different from the first embodiment in the point that only one set of communication line 15b is used between the upper differential communication circuit 26a and lower differential communication circuit 25b, forming a two-way communication channel.

The same parts as those of the first embodiment are denoted by the same reference numbers, and a detailed explanation thereof will be omitted.

FIG. 7 shows the configurations of the assembled battery monitoring circuit 13 according to the second embodiment.

The lower differential communication circuit 25a has a changeover switch 71a inside, and the upper differential communication circuit 26a has a changeover switch 72a inside.

The changeover switch 71a is a double switch, which switches between the output from the comparator 535a and the input to the output buffer 525a, and is controlled by the monitoring circuit 22a. The changeover switch 72a inside the upper differential communication circuit 26a is not directly driven by a changeover switch control signal from the monitoring circuit 22a, and is driven by a signal whose level is shifted by the level shift circuit 24a.

In FIG. 7, the changeover switch 72a is shown as a single-pole double-throw switch, which alternatively switches an input and output, but the switch may be a double single-pole single-throw switch depending on a switching control method of the monitoring circuit 22a, and the input may be always connected.

Third Embodiment

A third embodiment is different from the first embodiment in the point that a direct-current converter circuit is not provided, and power is supplied from an upper module.

The same parts as those of the first embodiment are denoted by the same reference numbers, and a detailed explanation thereof will be omitted.

Figure 8:
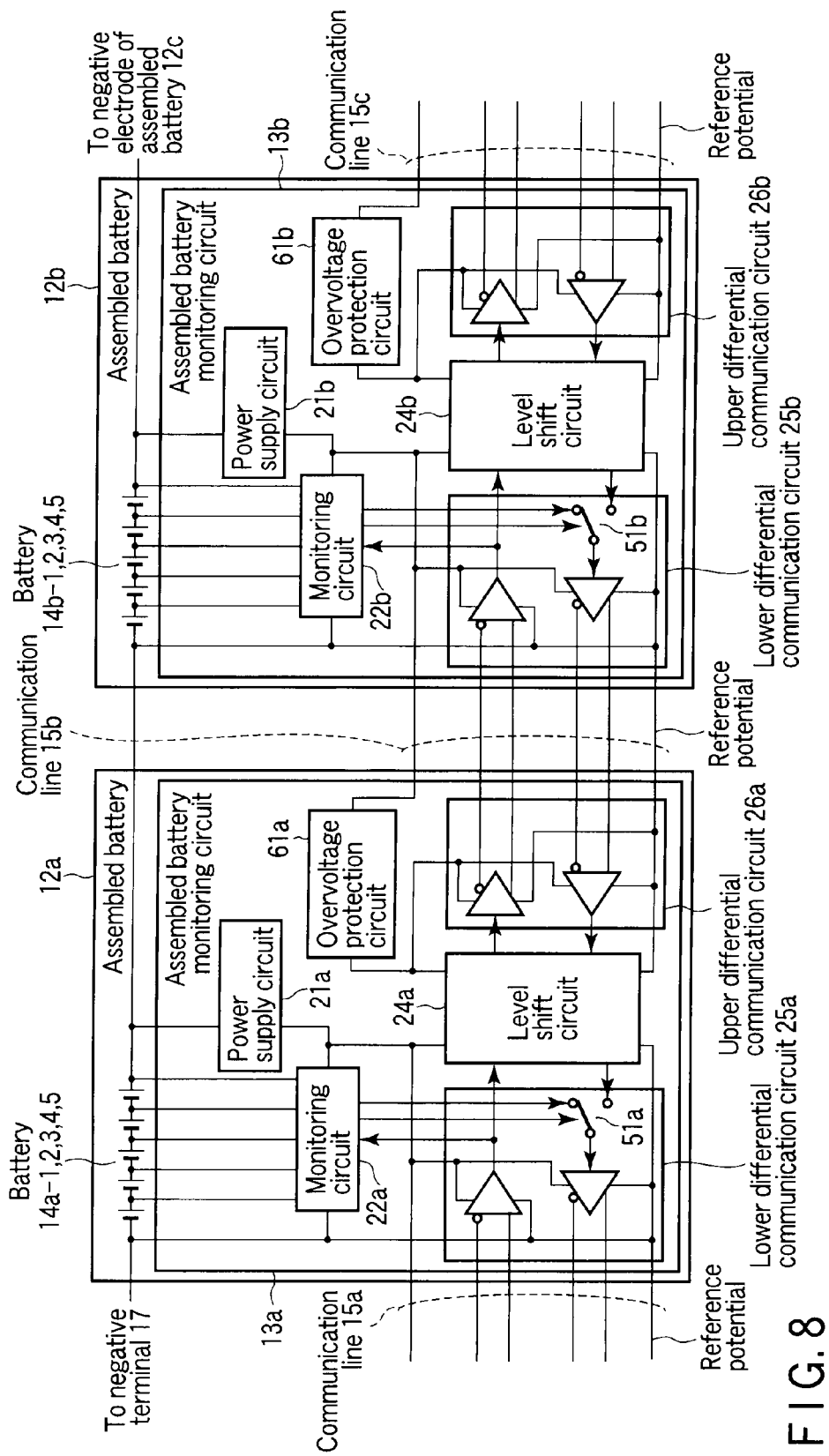
FIG. 8 shows exemplary configurations of assembled battery monitoring circuits according to an embodiment.

FIG. 8 shows the configurations of the assembled battery monitoring circuits 13a and 13b according to the third embodiment.

In the third embodiment, protection circuits 61a and 61b are provided to prevent breakage of a circuit when the battery connected in series is accidentally disconnected. When an abnormal voltage is applied to a circuit, the protection circuits 61a and 61b stop power supply to lower modules. It is also possible to configure the protection circuits 61a and 61b to turn off the connections of all communication lines 15a to 15c, when an abnormal voltage is applied to a circuit.

In the third embodiment, a direct-current converter circuit is unnecessary, and depending on the voltage protected by the protection circuit, differential communication is possible without providing an expensive large power consumption isolation circuit, even in a simpler configuration in which a reference potential difference is as high as several tens of volts.

Figure 9:
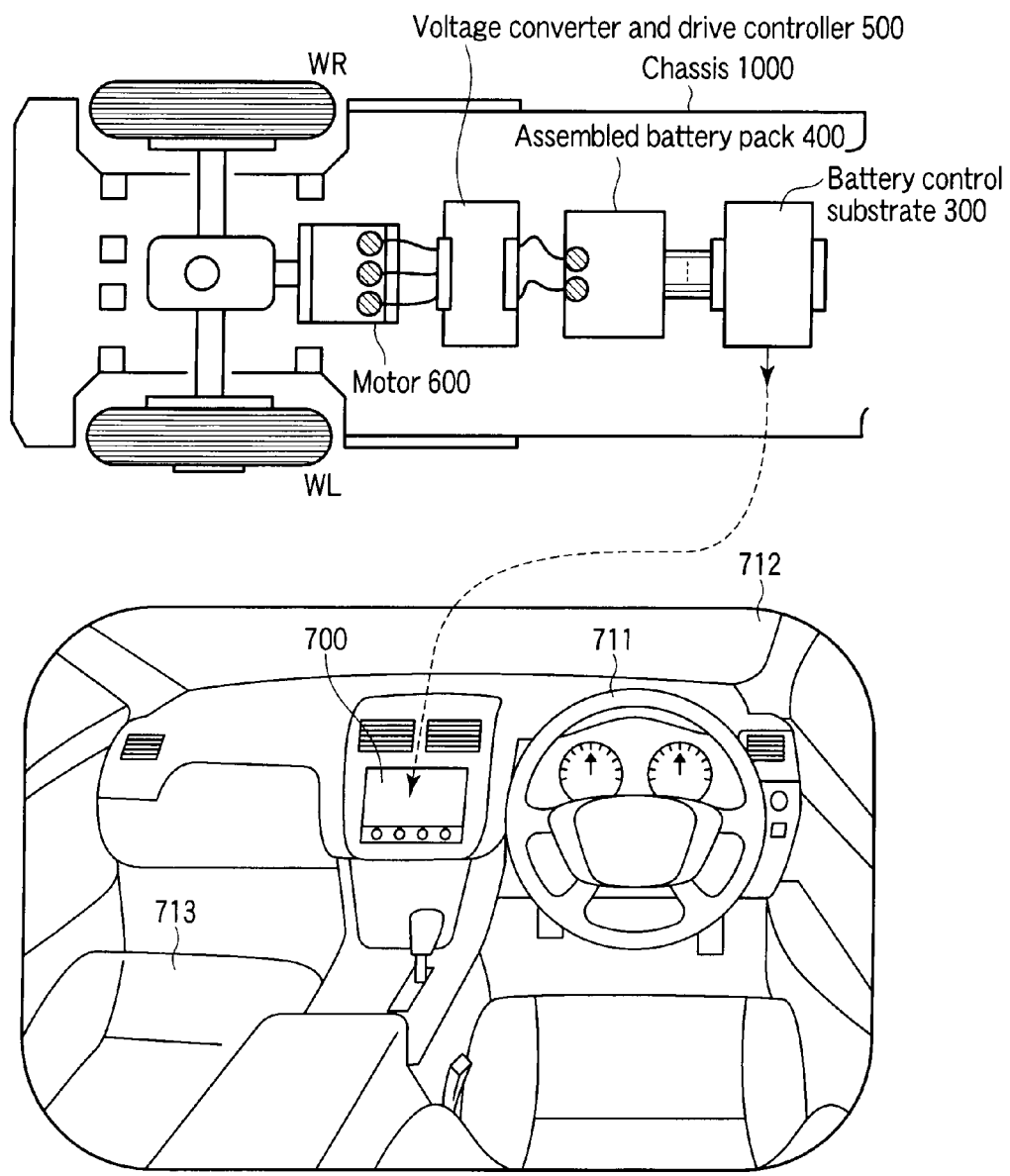
FIG. 9 is an exemplary diagram showing an exemplary system in a case where an assembled battery module using the assembled battery monitoring circuit according to the embodiment is mounted in an electric car or a hybrid car according to an embodiment.

FIG. 9 is a diagram showing an exemplary system in the case where the assembled battery module 1 using the assembled battery monitoring circuit according to the embodiment is mounted in an electric car or a hybrid car. Reference number 1000 denotes a chassis of a car.

A battery pack 400 contains one or more assembled batteries 12 shown in FIG. 1. The positive and negative electrodes of the battery pack 400 are connected to a voltage converter and operation controller 500, which includes an inverter, converts a voltage, and controls the levels and phases of output current and voltage according to an operation instruction. The output of the voltage converter and operation controller 500 is supplied to a motor 600 as drive power. The rotation of the motor 600 is transmitted to drive wheels WR and WL through a differential gear unit, for example.

A battery control substrate 300 is equivalent to the assembled battery module control circuit 11 shown in FIG. 1, and includes a circuit which controls the states of the assembled battery and makes communication (including a controller, a communication interface, and a memory). An alert signal from a communication interface is supplied to a display 700 in an instrument mounting area in an operation room, for example. The display 700 preferentially displays an alert signal when the battery life is coming to the end. Usually, the display 700 functions as a navigator. A method of displaying an alert is available in various types. For example, the number of cells going to be expired may be displayed. A remaining life bar may be displayed. An output capacity may be graphically displayed based on an internal resistance and remaining battery life. In FIG. 9, reference number 711 denotes a steering wheel, 712 denotes a windshield, and 713 and 714 denote seats.

In a vehicle of the embodiment, since the remaining state of charge (SOC) is exactly known, the battery capacity can be widely used without being overcharged or over-discharged, the number of cells can be decreased, and smooth operation is possible.

In FIG. 1, the assembled batteries are connected, so that the potential is increased from the battery 14a to 14c, but the configuration is not limited to this.

Further, in FIG. 1, the communication line 15a from the assembled battery module control circuit 11 is first connected to the assembled battery monitoring circuit 13a. The connection direction may be reversed, and the communication line may be first connected to the assembled battery monitoring circuit 13c.

Fourth Embodiment

A fourth embodiment is different from the first embodiment in the point that a communication signal is transmitted in one direction only. The same parts as those of the first embodiment are denoted by the same reference numbers, and a detailed explanation thereof will be omitted.

FIG. 10 is a diagram showing an assembled battery module using an assembled battery monitoring circuit according to the fourth embodiment. The communication lines 15a to 15d are connected to go around the circuit formed by the assembled battery module control circuit 11 and assembled battery monitoring circuits 13a to 13c.

FIG. 11 is a diagram showing the configurations of the assembled battery monitoring circuits 13a and 13b according to the fourth embodiment.

In the assembled battery monitoring circuit 13a, each of the lower differential communication circuit 25a and upper differential communication circuit 26a may be provided with one differential amplifier. Similarly, the level shift circuit 24a may be provided with only one upper logical transmission circuit 241a.

Transmission and reception of a communication signal is now explained. An instruction from the assembled battery module control circuit 11 is transmitted from the lower differential communication circuit 25a to the monitoring circuit 22a through the communication line 15a. A measurement signal indicating the states (voltage and temperature) of the battery 14a from the monitoring circuit 22a is transmitted to the signal line 15b through the upper logical transmission circuit 241a and upper differential communication circuit 26a. The measurement signal is received by the assembled battery control circuit 11 through the communication lines 15c and 15d.

In the fourth embodiment, the assembled battery module control circuit 11 comprehensively controls communication to prevent collision of communication signals.

In FIG. 11, a communication signal is transmitted in the direction from the lower to the upper circuit. The assembled battery monitoring circuit may be configured to transmit a communication signal in the direction from the upper to the lower circuit. For example, in the configuration of the assembled battery monitoring circuit 13a, each of the lower differential communication circuit 25a and upper differential communication circuit 26a are provided with one differential amplifier in the direction opposite to that shown in FIG. 11. The level shift circuit 24a is provided with only one lower logical transmission circuit 242a.

In FIG. 11, each assembled battery monitoring circuit has a reference potential. As described in the above embodiments, a reference potential may be obtained from an upper assembled battery monitoring circuit. The other parts of the assembled battery monitoring circuit may adopt the configurations of the above embodiments.

In FIG. 10, the assembled batteries are connected, so that the potential is increased from the battery 14a to 14c, but the configuration is not limited to this.

According to the fourth embodiment, since the communication signal is transmitted in one direction only, the configuration of the assembled battery monitoring circuits 13a to 13c can be simplified, and the cost can be reduced.

The functions explained in the above embodiments may be configured by using hardware, or may be realized by reading programs describing the functions into a computer. The functions may be configured by selecting one of appropriate software and hardware.

Further, the functions may be realized by reading programs stored on a not-shown recording medium into a computer. In this embodiment, the recording medium may be of any recording format, as long as it can record a program and can be read by a computer.

The embodiments are not limited to those described herein. The embodiments may be realized in practical phase by modifying the constituent elements without departing from its essential characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A communication circuit comprising:
   a first reference potential input terminal configured to receive a first reference potential;

a first power supply potential input terminal configured to receive a first power supply potential different from the first reference potential by a predetermined potential;

a second reference potential input terminal configured to receive a second reference potential;

a direct-current converter circuit configured to generate a second power supply potential different from the second reference potential by the predetermined potential, from the first power supply potential;

a first receiving circuit configured to receive a binary communication signal, whose one level is at the first reference potential, through the first signal input terminal, by a differential transmission method;

a first level shift circuit configured to convert the communication signal received by the first receiving circuit into a binary communication signal, whose one level is at the second reference potential, and the other level is at the second power supply potential; and a first transmission circuit configured to output the binary communication signal converted by the first level shift circuit, through a first signal output terminal, by a differential transmission method.

2. The communication circuit according to claim 1, wherein the first level shift circuit comprises:

a first switch which is operated by a binary communication signal whose low level is at a first reference potential, and outputs an intermittent binary signal at the first reference potential; and a second switch which selects the second power supply potential of the direct-current converter circuit and the second reference potential, and generates a binary communication signal, by the binary signal output from the first switch.

3. An assembled battery unit comprising:

an assembled battery in which a plurality of cells are secured at relative positions and electrically connected;

a monitoring circuit which measures the states of the cells, and outputs the measurement result; and a communication circuit according to claim 1, which transmits the measurement result.

4. The assembled battery unit according to claim 3, wherein at least one of the first reference potential and second reference potential is at the potential of one of the electrodes of the assembled battery.

5. The assembled battery unit according to claim 3, wherein at least one of the first reference potential and second reference potential is at the potential of one of the electrodes of other assembled batteries communicably connected to the assembled battery.

6. An assembled battery unit comprising:

an assembled battery in which a plurality of cells are secured at relative positions and electrically connected;

a monitoring circuit which measures the states of the cells, and outputs the measurement result; and a communication circuit according to claim 2, which transmits the measurement result.

7. A vehicle comprising:

a plurality of assembled battery units as defined in claim 3, in each of which assembled batteries are electrically connected, a communication circuit being electrically connected to the assembled battery units;

a controller electrically connected to the communication circuit and configured to control power input/output with reference to the assembled battery units, by using information received from the communication circuit and pertaining to the assembled batteries; and a motor which rotates an axle by the power.

8. The communication circuit according to claim 1, further comprising:

a second receiving circuit configured to receive a binary communication signal, whose one level is at the second reference potential, through the second signal input terminal, by a differential transmission method;

a second level shift circuit configured to convert the communication signal received by the second receiving circuit, into a binary communication signal, whose one level is at the first reference potential and the other level is at the first power supply potential; and a second transmission circuit configured to output the binary communication signal converted by the second level shift circuit through a second signal output terminal by a differential transmission method.

9. The communication circuit according to claim 8, wherein the second level shift circuit comprises:

a third switch which is operated by a binary communication signal, whose one level is at the second reference potential, and outputs an intermittent binary signal at the second power supply potential; and a fourth switch which selects the first power supply potential and first reference potential, and generates a binary communication signal, by the binary signal output from the third switch.

10. An assembled battery unit comprising:

an assembled battery in which a plurality of cells are secured at relative positions and electrically connected;

a monitoring circuit which measures the states of the cells, and outputs the measurement result; and a communication circuit according to claim 8, which transmits the measurement result.

11. The assembled battery unit according to claim 10, wherein at least one of the first reference potential and second reference potential is at the potential of one of the electrodes of the assembled battery.

12. The assembled battery unit according to claim 10, wherein at least one of the first reference potential and second reference potential is at the potential of one of the electrodes of other assembled batteries communicably connected to the assembled battery.

13. An assembled battery unit comprising:

an assembled battery in which a plurality of cells are secured at relative positions and electrically connected;

a monitoring circuit which measures the states of the cells, and outputs the measurement result; and a communication circuit according to claim 9, which transmits the measurement result.

14. A vehicle comprising:

a plurality of assembled battery units as defined in claim 10, in each of which assembled batteries are electrically connected, a communication circuit being electrically connected to the assembled battery units;

a controller electrically connected to the communication circuit and configured to control power input/output with reference to the assembled battery units, by using information received from the communication circuit and pertaining to the assembled batteries; and a motor which rotates an axle by the power.

* * * * *